(12) United States Patent
Dailey et al.

(10) Patent No.: US 6,601,296 B1
(45) Date of Patent: Aug. 5, 2003

(54) MULTI-SHOT INJECTION MOLDING PROCESS FOR MAKING ELECTRICAL CONNECTORS AND THREE-DIMENSIONAL CIRCUITS

(75) Inventors: Daniel Phillip Dailey, West Bloomfield, MI (US); Mohan R. Paruchuri, Canton, MI (US); Prathap Amerwai Reddy, Farmington Hills, MI (US)

(73) Assignee: Visteon Global Technologies, Inc., Dearborn, MI (US)

( * ) Notice: Subject to any disclaimer, the term of this patent is extended or adjusted under 35 U.S.C. 154(b) by 0 days.

(21) Appl. No.: 09/347,735

(22) Filed: Jul. 6, 1999

(51) Int. Cl.[7] ............................................. H01R 43/24
(52) U.S. Cl. ............................. 29/848; 29/880; 29/883; 29/884; 29/858; 264/328.8; 264/272.14; 164/98; 439/606; 439/736
(58) Field of Search .......................... 29/880, 883, 884, 29/885, 848, 858, 527.2, 874, 875, 849; 264/328.7, 328.8, 279.1, 272.14; 164/91, 98; 439/606, 736

(56) References Cited

U.S. PATENT DOCUMENTS

| | | | | |
|---|---|---|---|---|
| 2,544,140 A | * | 3/1951 | Dofsen et al. | |
| 2,663,910 A | * | 12/1953 | Danielson et al. | |
| 2,765,555 A | * | 10/1956 | Gits et al. | |
| 3,031,722 A | * | 5/1962 | Gits | |
| 3,164,864 A | * | 1/1965 | Kobayashi | |
| 3,173,176 A | * | 3/1965 | Kobayashi | |
| 3,178,497 A | * | 4/1965 | Moscicki | |
| 3,747,210 A | * | 7/1973 | Kroll | |
| 3,800,020 A | * | 3/1974 | Parfet | 29/849 X |
| 4,165,959 A | * | 8/1979 | Dechavanne | |
| 4,373,127 A | * | 2/1983 | Haskett et al. | 29/880 |
| 4,385,025 A | * | 5/1983 | Salerno et al. | 264/328.7 |
| 4,404,744 A | * | 9/1983 | Stenz et al. | |
| 4,812,353 A | * | 3/1989 | Yumoto | |
| 4,858,313 A | * | 8/1989 | Bowlin | |
| 4,888,307 A | * | 12/1989 | Spairisano et al. | 29/848 |
| 4,996,170 A | * | 2/1991 | Baird | 264/272.17 |
| 5,259,111 A | * | 11/1993 | Watanabe | |
| 5,371,043 A | * | 12/1994 | Anderson et al. | 164/91 |
| 5,428,891 A | * | 7/1995 | Samarov | |
| 5,626,483 A | * | 5/1997 | Naitoh | |
| 5,725,392 A | * | 3/1998 | Bianca et al. | |
| 5,846,477 A | * | 12/1998 | Hotta et al. | 264/272.14 |
| 5,979,048 A | * | 11/1999 | Nishikawa et al. | 29/885 |

FOREIGN PATENT DOCUMENTS

JP        1-95588        *   4/1989   ................. 29/849

* cited by examiner

Primary Examiner—A. Dexter Tugbang
(74) Attorney, Agent, or Firm—John E. Kajander

(57) ABSTRACT

A method of making an article, such as an electrical connector includes an injection-molded plastic substrate and a pattern of injection-molded metal conductors supported on and mechanically interlocked with the substrate, wherein one of the substrate and the conductors is over-molded onto the other of the substrate and the conductors.

15 Claims, 3 Drawing Sheets

MULTI-SHOT INJECTION MOLDING PROCESS FOR MAKING ELECTRICAL CONNECTORS AND THREE-DIMENSIONAL CIRCUITS

TECHNICAL FIELD

The invention relates to processes used in the manufacture of generally electrically nonconductive articles which include an electrically conductive surface layer, such as electrical connectors having a conductor pattern defined on the connector's relatively resilient, electrically nonconductive substrate.

BACKGROUND OF THE INVENTION

The prior art teaches.the manufacture of electrical connectors featuring a molded relatively resilient, electrically nonconductive, typically plastic substrate whose surface is coated with an electrically conductive, typically metallic layer, as through an electrolytic or chemical vapor deposition process. Such prior art processes typically require the masking, etching and plating of the substrate, or the deposition of multiple surface layers, or other equally time-consuming and costly process steps.

Alternatively, the prior art teaches the manufacture of electrical connectors using an insert molding process, wherein a metallic insert is placed inside a mold cavity, whereupon the connector's plastic housing is molded surrounding the insert to obtain the connector. And, in yet another prior art process, a plastic connector substrate is separately molded in a single-shot process, whereupon metallic contacts are mechanically inserted into interference fit with suitable recesses molded into the plastic substrate. These alternate prior art processes are similarly characterized by relatively slow production rates and high manufacturing costs due to the high degree of precision mechanical manipulation required to assemble each connector.

The prior art also teaches a two-shot injection molding process for making an electrical connector, in which a platable resin is first molded, and then a second nonplatable polymeric resin is over-molded onto the first platable resin. A layer of an electrically conductive material is thereafter plated onto the platable resin, with the nonplatable resin itself acting as a plating mask.

The prior art teaches a similar type of two-shot injection molding process for making two-color plastic typewriter keys. In a first approach, the key's exterior.surface or "shell," including a void in the shape of the desired key character, is first molded in what is generally known as a "shell-first" two-shot injection molding. More specifically, in a typical prior art shell-first molding process for making a shell-first article, the first shot forms the article's shell and character voids using a first of two male dies and one female die. The first male die is then withdrawn from the shell, whereupon the shell is held by the female die as a second, somewhat smaller male die is mated with the female die. The second shot then fills the inside of the article, i.e., molds the article's core as well as the character voids, with a different color material.

Alternatively, a key is molded "core-first" by means of a single male die which is used with a first-shot female die. The first female die-is then withdrawn, leaving the key's core on the male die. The key's core includes the key's character as a raised surface. The male die is now mated with a somewhat larger second female die, and a second-shot forms the key's shell. The over-molded shell thus surrounds, but does not cover, the key's raised character. The use of rotary, movable and reciprocating mold dies to facilitate two-shot molding is also known in the prior art.

What is still needed, however, is a method of making an article, such as an electrical connector, which includes an electrically conductive surface layer over a relatively resilient, electrically nonconductive substrate, which features a mechanical interlock between the surface layer and the substrate to improve performance and, preferably, whose surface layer is of variable thickness to provide enhanced mechanical properties.

DISCLOSURE OF INVENTION

Accordingly, an object of the invention is to provide a method for making articles having an electrically conductive conductor pattern on at least one surface thereof, such as electrical connectors, featuring lower cost and less complexity in comparison with known methods.

Under the invention, a method for making an article having an electrically conductive conductor pattern on at least one surface thereof includes: injection molding a first one of the group consisting of a substrate and a surface layer; and injection molding a second one of the group consisting of a substrate and a surface layer, the second one being over-molded on the first one, wherein the substrate is molded of an electrically nonconductive material and the surface layer is molded of an electrically conductive material, and wherein the second one is over-molded on the first one.

In accordance with the invention, while the first and second materials are any electrically nonconductive and electrically conductive materials suitable for use in an injection molding process, in a preferred embodiment, the first material is preferably a relatively resilient polymer or "plastic," such as a 6/6 nylon or a thermoset plastic, and the second material is preferably a tin-based or copper-based alloy. And, where the electrically conductive material is a metal which is first injection-molded, the metal has a higher melting point than the softening point of the plastic. Alternatively, where the metal is over-molded on the injection-molded plastic substrate, an exemplary method preferably further includes slightly melting the molded plastic substrate when injection-molding the metal surface layers.

In accordance with another feature of the invention, an exemplary method for making an article having an electrically conductive conductor pattern on at least one surface thereof preferably includes defining a first mold cavity between a first and second mold die, the first mold cavity being characterized by a variable spacing between the first and second mold dies; and injection molding the first one into the first mold cavity to obtain a first molded portion of the article, the first molded portion includes at least one surface feature. The method further includes removing the second mold die; defining a second mold cavity between the first mold die and a third mold die, a portion of the second mold cavity being bounded by the at least one surface feature of the first molded portion; and injection molding the second one into the second mold cavity to obtain a second molded portion of the article, the second molded portion including at least one surface feature complementary to the at least one surface feature of the first molded portion to thereby mechanically interlock the second molded portion with the first molded portion.

Still further, in accordance with yet another feature of the invention, the at least one surface feature of the second molded portion formed during the second injection molding step completely penetrates through the at least one surface feature of the first molded portion.

In accordance with another feature of the invention, the resulting connector advantageously includes a metallic surface layer of varying thickness with which to define the conductor pattern, with the metallic surface layer being mechanically interlocked with the plastic substrate to improve connector reliability and performance. And, because the preferably nylon substrate is relatively resilient, the resulting connector advantageously accommodates minor misalignment of the mating connector pins and sockets without breaking.

The above object and other objects, features, and advantages of the present invention are readily apparent from the following detailed description of the best mode for carrying out the invention when taken in connection with the accompanying drawings.

BEST MODE FOR CARRYING OUT THE INVENTION

As noted above, the invention relates to that type of two-shot injection molding wherein the first and second "shots" respectively form one and then the other of the connector's resilient electrically nonconductive substrate and the connector's relatively thin conductive surface layer. More specifically, injection molding is a process by which a malleable material is forced under pressure into a closed mold. The material solidifies within the relatively cooler mold cavity, whereupon the molded material retains the shape of the mold. The finished molded part is then ejected from the mold cavity.

Figure 1:
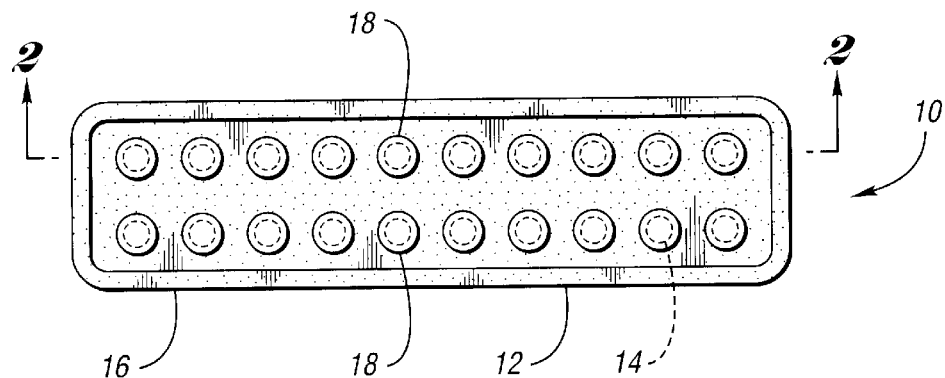
FIG. 1 is an end view of a multi-pin electrical connector manufactured in accordance with the invention.
Figure 2:
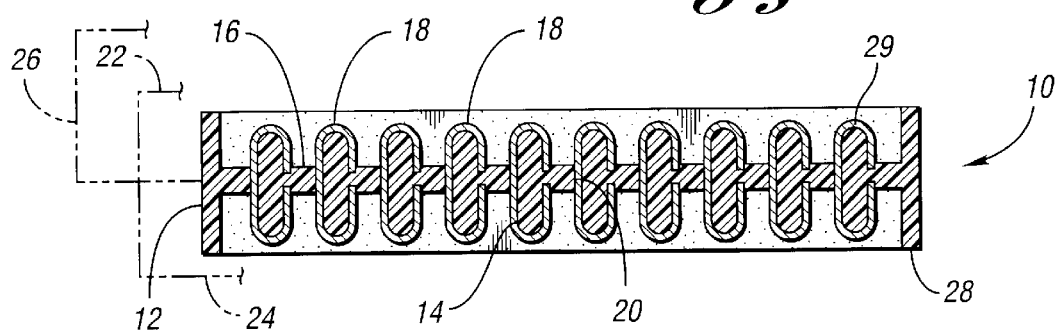
FIG. 2 is a longitudinal cross-sectional view of the electrical connector along line 2—2 of FIG. 1.

Referring to the Drawings, FIGS. 1 and 2 respectively show an end view and a longitudinal cross-sectional view of an exemplary multi-pin connector 10 manufactured from a two-shot injection molding process in accordance with the invention. Specifically, during a first "shot," the connector shell 12 and pin cores 14 are respectively molded between a suitable pair of mold dies represented at 22 and 24 (FIG. 2) using a relatively resilient plastic material, such as a 6/6 Nylon, which has been brought to its melting point in any suitable manner. After the molten plastic material has been injected between the mold dies 22 and 24 in cavity 28 and the resulting molded plastic substrate 16 has been permitted to cool, one of the pair of mold dies, for example 22 is removed and a third die 26 is positioned adjacent to the molded plastic substrate, i.e., the molded connector shell 12 and pin cores 14. In this manner, a second mold cavity 29 that becomes occupied by injected surface layer 18 is defamed between the dies 24 and 26, wherein a portion of the second mold cavity 29 is bounded by one or more surface features (e.g., the pin cores 14) of the molded plastic substrate 16.

During the second "shot," a molten metal is simultaneously injected through a common gating system (not shown) so as to flow within the second mold cavity 19 over and into the one or more surface features (e.g., the pin cores 14) of the molded plastic substrate 16. In this manner, the metal is overmolded on the substrate's pin cores 14 to thereby provide an electrically conductive surface layer 18 on the molded plastic substrate 16. While any suitable metal may be used, in a preferred embodiment, the metal used in the second "shot" is one of the group consisting of pure tin, tin-based alloys of silver and/or copper, and copper-based alloys.

Still further, as best seen in FIG. 2, molten metal flows during the second shot into a variety of ancillary surface features which have been previously defined in the molded plastic substrate 16 during the first injection molding step. More specifically, the first pair of dies 15a, 15b used during the first injection molding step preferably define a first mold cavity 21 characterized by a variable spacing between the first and second mold dies 15b, 15b and, most preferably, by a plurality of apertures 20 extending completely through the molded plastic substrate 16. During the second injection molding step, molten metal flows into each aperture 20 so as to completely penetrate the molded plastic substrate 16 proximate to the aperture 20. In this manner, the resulting metal surface layer 18 becomes mechanically interlocked with the molded plastic substrate 16, thereby providing superior mechanical properties to the resulting pin connector 10.

Figure 3:
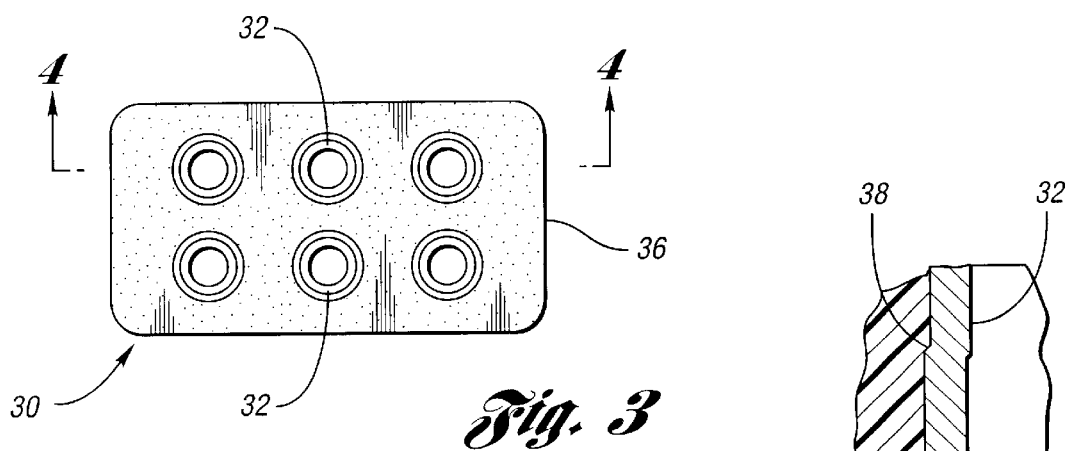
FIG. 3 is an end view of a multi-socket electrical connector manufactured in accordance with the invention.
Figure 5:
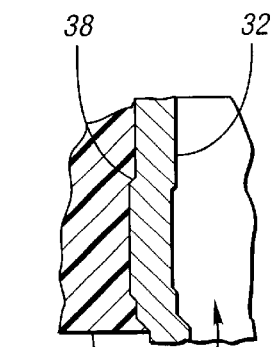
FIG. 5 is an enlarged partial cross-sectional view taken within Circle 5 of FIG. 4.
Figure 4:
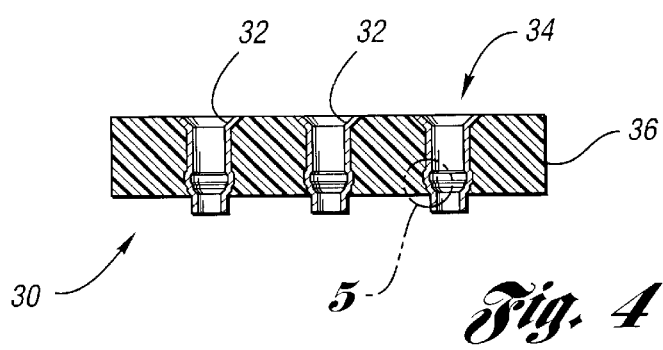
FIG. 4 is a longitudinal cross-sectional view of the electrical connector taken along line 4—4 of FIG. 3.
Figure 6:
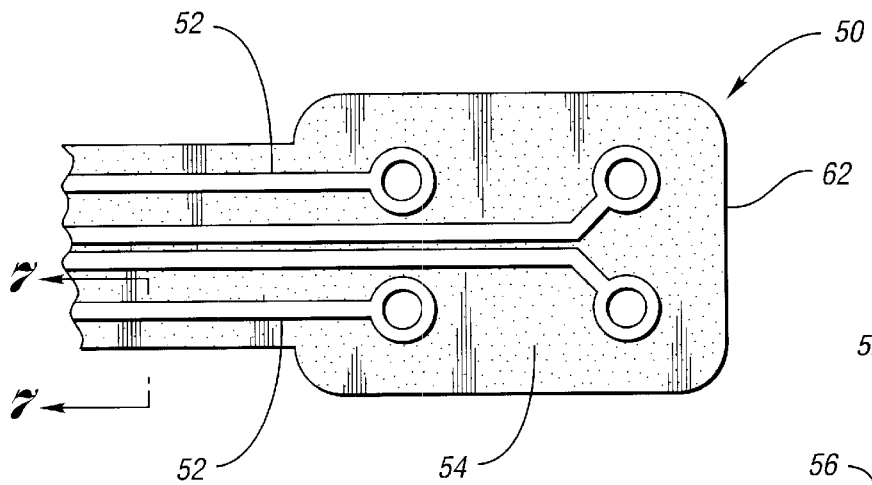
FIG. 6 is a partial plan view of the underside of an elongate molded plastic connector manufactured in accordance with the invention.
Figure 7:
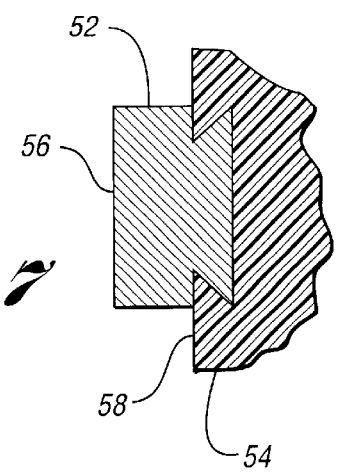
FIG. 7 is an enlarged partial cross-sectional view taken along line 7—7 of FIG. 6.
Figure 8:
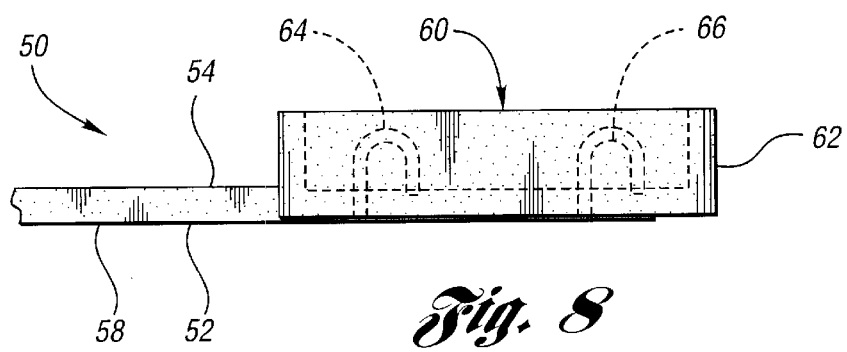
FIG. 8 is a top plan view of the end of the elongate molded plastic connector of FIG. 6.
Figure 9:
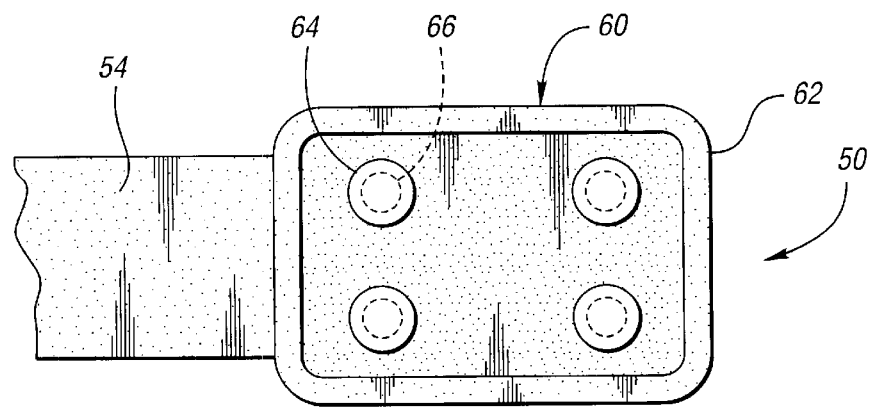
FIG. 9 is a side elevational view of the end of the elongate molded plastic connector of FIG. 6.

FIGS. 3–5 show various views of an exemplary multi-pin socket connector 30, similarly manufactured from a two-shot injection molding process in accordance with the invention. Specifically, in the case of the socket connector 30, the sleeve-like metal surface layers 32 defining the several individual connector sockets 34 are formed during the first "shot," with the plastic connector shell 36 being thereafter overmolded about the metal surface layers 32 during the second "shot."

As best seen in FIG. 5, in accordance with another feature of the invention, the metal surface layers 32 are preferably formed with a varying thickness to provide a surface feature 38 thereon which will serve to mechanically interlock the metal surface layer 32 within the overmolded plastic connector shell 36. It will be appreciated that the invention contemplates use of any suitable geometries, including undercuts, outward flares, surface finishes and the like, whereby a given connector's metal surface layers are embedded in, or are otherwise mechanically interlocked with, the connector's molded plastic substrate.

Thus, the invention advantageously provides connectors 10, 30 whose conductive pins or sockets are supported by a relatively resilient molded plastic substrate serving to reduce the amount of coupling force required to mate the connectors 10, 30, notwithstanding any slight misalignment of the pins and sockets during mating. Further, the resilient substrate or core within each connector pin or socket acts as a rigidizer to increase the ability of the pins to be bent without permanent deformation or cracking/failure of the metallic surface layer.

FIGS. 6–9 show a second exemplary article, an elongate molded plastic member 50 in which a plurality of longitudinally extending, electrically conductive traces 52 have been mechanically imbedded in the member's molded plastic substrate 54 using the two-shot injection molding process of the invention. More specifically, as seen in the cross-sectional view illustrated in FIG. 7, each of the injection-molded traces 52 is mechanically retained within an undercut channel 56 formed in the molded plastic substrate's lower surface 58.

In accordance with another feature of the invention, the plastic member 50 includes n multi-pin connector 60 defined at each of the member's longitudinal ends 62 (with only one end 62 of the plastic member 50 being illustrated in FIGS. 6–9). Each end connector 60 features metal surface layers 64 covering resilient pin cores 66, with the further benefit that the metal surface layers 64 are integrally formed with the longitudinal traces 52, thereby providing increased reliability. Indeed, it will be appreciated that the molded plastic member 50, with its integral electrically conductive traces 52, eliminates the need for a separate wiring harness or other interconnection device between the member's end connectors 60. The mechanical interlocks between the traces 52 and the channel 56, and between the metal surface layers 64 and the pin cores 66, further reduce the likelihood of the delamination of any given conductive trace 52 from the member's molded plastic substrate 54.

Figure 10:
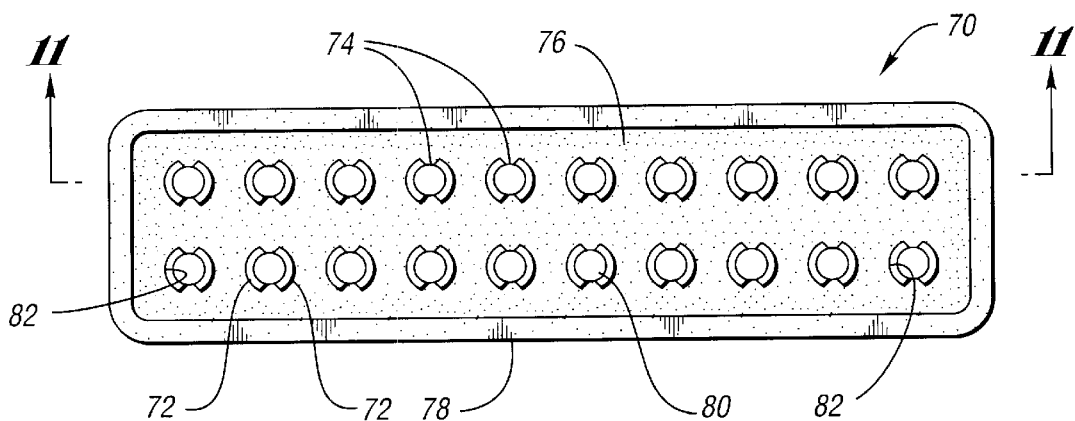
FIG. 10 is an end view of another multipin electrical connector manufactured in accordance with the invention.
Figure 11:
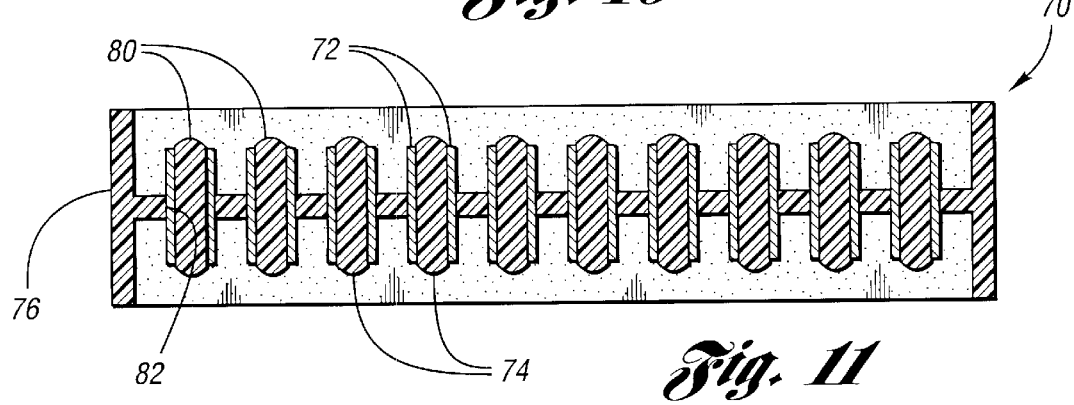
FIG. 11 is a longitudinal cross-sectional view of the electrical connector of FIG. 10 along line 11—11 thereof.
Figure 12:
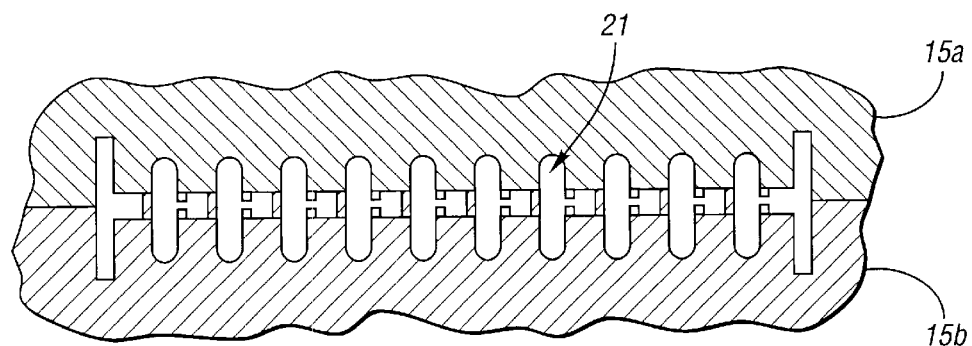
FIGS. 12 and 13 are conceptual cross-sectional views of the die pairs used to define the first and second mold cavities, in accordance with the method of the invention.
Figure 13:
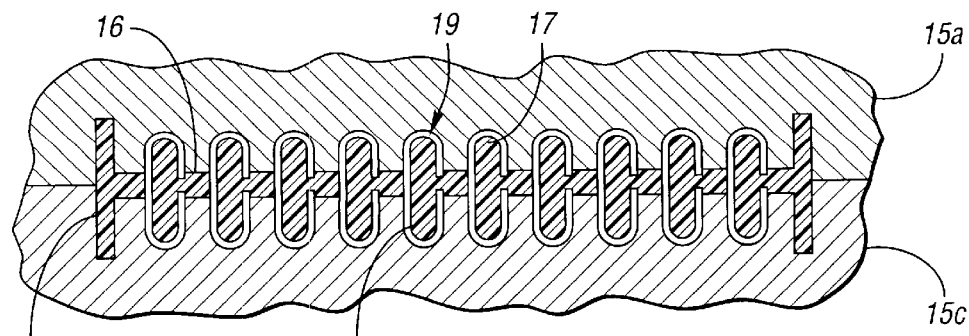

FIGS. 10 and 11 show a further multi-pin electrical connector 70 manufactured from a two-shot injection molding process in accordance with the invention. The connector 70 includes multiple, electrically-isolated traces or surface layers 72 on each of the connector's pins 74 to thereby provide a high-density connector capable of carrying multiple signals over each pin 74.

As in the case of the multi-pin connector illustrated in FIGS. 1–4, a plastic substrate 76 defining the connector's shell 78 and pin cores 80 is first injection molded in a first mold cavity defined between a suitable pair of mold dies (not shown). During a subsequent "shot," a molten metal, such as a copper alloy, is simultaneously injected through a common gating system (not shown) so as to flow within a second mold cavity defined over certain diametrical portions of each pin core 80 and, preferably, into various surface features of the molded plastic substrate 76, e.g, into an aperture 82 extending through the molded plastic substrate 76 proximate to each pin core 80. In this manner, the metal is overmolded onto the substrate's pin cores 78 and into the surface features 82 to thereby provide the multiple electrically conductive surface layers 72 on each pin 74 which are mechanically interlocked with the molded plastic substrate 76.

In accordance with a further feature of the invention, in the preferred method for making the multi-pin connector 70 illustrated in FIGS. 10 and 11, the plastic substrate 76 is molded first in order to provide the relatively fine surface features (for example, apertures 82) into which the subsequent molten metal can flow before the molten metal "freezes" within the second mold cavity. Thus, in the preferred method, the plastic and metal materials used to make the connector 70 are preferably chosen such that the molten metal does not substantially melt/deform the previously molded plastic substrate. Indeed, in the event that a metal material is selected having a melting temperature substantially greater than the softening temperature of the plastic material of the substrate 76, the metal layers 72 are preferably molded first, with the plastic material thereafter being "overmolded" in the second "shot."

While the best mode for carrying out the invention has been described in detail, those familiar with the art to which this invention relates will recognize various alternative designs and embodiments for practicing the invention within the scope of the appended claims. For example, the invention contemplates use of any suitable two-shot molding die sets, whose use may require a rotary die-carrying mechanism, wherein a plurality of upper dies carries the first-shot molding from the first-shot injector to a second-shot injector; a reciprocating male die mechanism, which carries the first-shot-molding from a first female die to a second female die for second-shot-molding; or a rotary two-injector mechanism, which first injects material into a shell-first mold, the mold opens, a reciprocating mold plate then moves from a first position to a second position to thereby change the mold from a first cavity configuration to a second cavity configuration, the mold closes, and the article's core is molded using the second injector.

What is claimed is:

1. A method for making an article having an electrically conductive conductor pattern on at least one surface thereof, the method comprising:

injection molding a substrate; and injection molding a surface layer defining the conductor pattern on the at least one surface of the article, wherein the substrate is molded of an electrically non-conductive material and the surface layer is molded of an electrically conductive material, the surface layer is overmolded on the substrate, and injection molding the surface layer includes slightly melting the substrate.

2. The method of claim 1, wherein the electrically non-conductive material is a relatively resilient polymer.

3. The method of claim 2, wherein the electrically non-conductive material is a 6/6 nylon.

4. The method of claim 1, wherein the electrically conductive material is a partially liquid metal having a melting point at a first temperature.

5. The method of claim 4, wherein the electrically non-conductive material is a polymer having a softening point at a second temperature less than the first temperature.

6. A method for making an article having an electrically conductive conductor pattern on at least one surface thereof, the method comprising:

injection molding a first one of a group consisting of a substrate and a surface layer, wherein injection molding the first one includes defining a first mold cavity between a first and second mold die, the first mold cavity being characterized by a variable spacing between the first and second mold dies;

injection molding the first one into the first mold cavity to obtain a first molded portion of the article, the first molded portion including at least one surface feature; and removing the second mold die; and injection molding a second one of the group consisting of the substrate and the surface layer, wherein the substrate is molded of an electrically nonconductive material and the surface layer is molded of an electrically conductive material, wherein the second one is overmolded on the first one, and wherein injection molding the second one includes defining a second mold cavity between the first mold die and a third mold die, a portion of the second mold cavity being bounded by the at least one surface feature of the first molded portion; and injection molding the second one into the second mold cavity to obtain a second molded portion of the article, the second molded portion including at least one surface feature complementary to the at least one surface feature of the first molded portion to thereby mechanically interlock the second molded portion with the first molded portion.

7. The method of claim 6, wherein the at least one surface feature of the second molded portion completely penetrates through the at least one surface feature of the first molded portion.

8. The method of claim 6, wherein injection molding the second one includes slightly melting the first molded portion.

9. A method for making an electrical connector comprising:

injection molding an electrically nonconductive connector substrate having at least one surface feature; and injection molding an electrically conductive surface layer, wherein the surface layer is overmolded on the at least one surface feature of the substrate, and wherein injection molding the surface layer partially melts the at least one surface feature of the substrate to thereby secure the surface layer onto the at least one surface feature of the substrate.

10. The method of claim 9, wherein the electrically nonconductive material is a relatively resilient polymer.

11. The method of claim 9, wherein the electrically conductive material is a partially liquid metal having a melting point at a first temperature.

12. The method of claim 11, wherein the electrically nonconductive material is a polymer having a softening point at a second temperature less than the first temperature.

13. A method for making an electrical connector comprising:

injection molding a first one of a group consisting of an electrically nonconductive connector substrate and an electrically conductive surface layer, wherein injection molding the first one includes defining a first mold cavity between a first and second mold die, the first mold cavity being characterized by a variable spacing between the first and second mold dies;

injection molding the first one into the first mold cavity to obtain a first molded portion of the connector, the first molded portion including at least one surface feature; and removing the second mold die; and injection molding a second one of the group consisting of the electrically nonconductive connector substrate and the electrically conductive surface layer, wherein the second one is overmolded on the first one, and wherein injection molding the second one includes defining a second mold cavity between the first mold die and a third mold die, a portion of the second mold cavity being bounded by the at least one surface feature of the first molded portion; and injection molding the second one into the second mold cavity to obtain a second molded portion of the connector, the second molded portion including at least one surface feature complementary to the at least one surface feature of the first molded portion to thereby mechanically interlock the second molded portion with the first molded portion.

14. The method of claim 13, wherein the at least one surface feature of the second molded portion completely penetrates through the at least one surface feature of the first molded portion.

15. The method of claim 13, wherein injection molding the second one includes slightly melting the first molded portion.

* * * * *